(12) United States Patent
Kantarovsky et al.

(10) Patent No.: US 10,923,577 B2
(45) Date of Patent: Feb. 16, 2021

(54) CAVITY STRUCTURES UNDER SHALLOW TRENCH ISOLATION REGIONS

(71) Applicant: GLOBALFOUNDRIES INC., Grand Cayman (KY)

(72) Inventors: Johnatan A. Kantarovsky, South Burlington, VT (US); Siva P. Adusumilli, South Burlington, VT (US); Vibhor Jain, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/241,441

(22) Filed: Jan. 7, 2019

(65) Prior Publication Data

US 2020/0219760 A1    Jul. 9, 2020

(51) Int. Cl.
*H01L 29/00* (2006.01)
*H01L 29/51* (2006.01)
*H01L 21/762* (2006.01)
*H01L 49/02* (2006.01)
*H01L 29/161* (2006.01)
(Continued)

(52) U.S. Cl.
CPC ...... *H01L 29/515* (2013.01); *H01L 21/02236* (2013.01); *H01L 21/02532* (2013.01); *H01L 21/3065* (2013.01); *H01L 21/76224* (2013.01); *H01L 28/10* (2013.01); *H01L 29/0649* (2013.01); *H01L 29/161* (2013.01); *H01L 21/0217* (2013.01); *H01L 21/0262* (2013.01); *H01L 21/02271* (2013.01); *H01L 21/31053* (2013.01); *H01L 21/764* (2013.01)

(58) Field of Classification Search
CPC .......... H01L 21/76224; H01L 21/3065; H01L 21/02532; H01L 29/161; H01L 21/02236; H01L 28/10; H01L 28/21; H01L 28/0262; H01L 21/0217; H01L 21/31053; H01L 21/02271; H01L 21/764; H01L 29/0649; H01L 21/76289; H01L 29/515
See application file for complete search history.

(56) References Cited

U.S. PATENT DOCUMENTS 4,710,794 A    12/1987    Koshino et al.
4,888,300 A    12/1989    Burton
(Continued)

FOREIGN PATENT DOCUMENTS

JP    2009099841    5/2009
TW    201711190    3/2017

OTHER PUBLICATIONS

Notice of Allowance in related TW Application No. 107112403 dated Mar. 27, 2019, 4 pages.
(Continued)

*Primary Examiner* — Shouxiang Hu
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to cavity structures under shallow trench isolation regions and methods of manufacture. The structure includes: one or more cavity structures provided in a substrate material and sealed with an epitaxial material; and a shallow trench isolation region directly above the one or more cavity structures in the substrate material.

20 Claims, 5 Drawing Sheets

(51) Int. Cl.
  *H01L 21/3065* (2006.01)
  *H01L 21/02* (2006.01)
  *H01L 29/06* (2006.01)
  *H01L 21/3105* (2006.01)
  *H01L 21/764* (2006.01)

(56) References Cited

U.S. PATENT DOCUMENTS

| | | | |
|---|---|---|---|
| 5,427,975 A | 6/1995 | Sparks et al. | |
| 5,844,299 A * | 12/1998 | Merrill | H01L 28/10 257/531 |
| 5,869,374 A | 2/1999 | Wu | |
| 5,943,581 A | 8/1999 | Lu et al. | |
| 5,949,144 A | 9/1999 | Delgado et al. | |
| 5,972,758 A | 10/1999 | Liang | |
| 6,093,330 A | 7/2000 | Chong et al. | |
| 6,093,599 A | 7/2000 | Lee et al. | |
| 6,057,202 A | 9/2000 | Chen et al. | |
| 6,140,197 A | 10/2000 | Chu et al. | |
| 6,255,704 B1 | 7/2001 | Iwata et al. | |
| 6,258,688 B1 | 7/2001 | Tsai | |
| 6,274,920 B1 * | 8/2001 | Park | H01L 27/08 257/277 |
| 6,307,247 B1 | 10/2001 | Davies | |
| 6,337,499 B1 | 1/2002 | Werner | |
| 6,376,291 B1 | 4/2002 | Barlocchi et al. | |
| 6,518,144 B2 | 2/2003 | Nitta et al. | |
| 6,518,147 B1 | 2/2003 | Villa et al. | |
| 6,551,944 B1 | 4/2003 | Fallica et al. | |
| 6,570,217 B1 | 5/2003 | Sato et al. | |
| 6,670,257 B1 | 12/2003 | Barlocchi et al. | |
| 6,720,229 B2 | 4/2004 | Norström et al. | |
| 6,833,079 B1 | 12/2004 | Giordani | |
| 6,835,631 B1 | 12/2004 | Zhen et al. | |
| 6,928,879 B2 | 8/2005 | Partridge et al. | |
| 6,992,367 B2 | 1/2006 | Erratico et al. | |
| 7,009,273 B2 | 3/2006 | Inoh et al. | |
| 7,053,747 B2 | 5/2006 | Joodaki | |
| 7,279,377 B2 | 10/2007 | Rueger et al. | |
| 7,294,536 B2 | 11/2007 | Villa et al. | |
| 7,326,625 B2 | 2/2008 | Jeong et al. | |
| 7,354,786 B2 * | 4/2008 | Benzel | G01L 9/0045 257/506 |
| 7,427,803 B2 | 9/2008 | Chao et al. | |
| 7,662,722 B2 | 2/2010 | Stamper et al. | |
| 7,678,600 B2 | 3/2010 | Villa et al. | |
| 7,906,388 B2 | 3/2011 | Sonsky | |
| 8,203,137 B2 | 6/2012 | Cho et al. | |
| 8,319,278 B1 | 11/2012 | Zeng et al. | |
| 8,575,690 B1 | 11/2013 | Hsieh | |
| 8,652,951 B2 | 2/2014 | Huang et al. | |
| 8,674,472 B2 | 3/2014 | Botula et al. | |
| 8,907,408 B2 | 12/2014 | Sedlmaier et al. | |
| 8,927,386 B2 | 1/2015 | Wu et al. | |
| 9,029,229 B2 | 5/2015 | Adkisson et al. | |
| 9,048,284 B2 | 6/2015 | McPartlin et al. | |
| 9,059,252 B1 | 6/2015 | Liu et al. | |
| 9,159,817 B2 | 10/2015 | Camillo-Castillo et al. | |
| 9,177,866 B2 | 11/2015 | Davies | |
| 9,224,858 B1 | 12/2015 | Camillo-Castillo et al. | |
| 9,324,846 B1 | 4/2016 | Camillo-Castillo et al. | |
| 9,349,793 B2 | 5/2016 | Jaffe et al. | |
| 9,355,972 B2 | 5/2016 | Dunn et al. | |
| 9,570,564 B2 | 2/2017 | Alperstein et al. | |
| 9,640,538 B2 | 5/2017 | Liu et al. | |
| 9,711,392 B2 | 7/2017 | Dehe et al. | |
| 9,722,057 B2 | 8/2017 | Camillo-Castillo et al. | |
| 9,726,547 B2 | 8/2017 | Liu et al. | |
| 9,917,186 B2 | 3/2018 | Laven et al. | |
| 9,922,973 B1 | 3/2018 | Shank et al. | |
| 10,062,757 B2 | 8/2018 | Toia et al. | |
| 10,109,490 B1 | 10/2018 | Lin et al. | |
| 10,446,643 B2 | 10/2019 | Adusumilli et al. | |
| 10,461,152 B2 | 10/2019 | Stamper et al. | |
| 2002/0043686 A1 | 4/2002 | Bolam et al. | |
| 2002/0195681 A1 | 12/2002 | Melendez et al. | |
| 2003/0067014 A1 * | 4/2003 | Tsuruta | H01L 21/76208 257/200 |
| 2004/0180510 A1 | 9/2004 | Ranade et al. | |
| 2004/0217434 A1 | 11/2004 | Lee et al. | |
| 2004/0217443 A1 | 11/2004 | Davies | |
| 2005/0176222 A1 | 8/2005 | Ogura | |
| 2006/0091453 A1 | 5/2006 | Matsuda et al. | |
| 2006/0138541 A1 | 6/2006 | Nakamura et al. | |
| 2006/0214258 A1 | 9/2006 | Kiyotoshi | |
| 2006/0228864 A1 | 10/2006 | Chen et al. | |
| 2007/0181920 A1 | 8/2007 | Renna et al. | |
| 2007/0238250 A1 | 10/2007 | Zhang et al. | |
| 2008/0044979 A1 | 2/2008 | Wells et al. | |
| 2008/0073747 A1 | 3/2008 | Chao et al. | |
| 2009/0072351 A1 | 3/2009 | Meunier-Beillard et al. | |
| 2009/0101997 A1 | 4/2009 | Lammel et al. | |
| 2009/0127648 A1 | 5/2009 | Chen et al. | |
| 2009/0191687 A1 | 7/2009 | Hong et al. | |
| 2010/0035403 A1 | 2/2010 | Brown et al. | |
| 2010/0059854 A1 | 3/2010 | Lin et al. | |
| 2010/0109120 A1 | 5/2010 | Fucsko et al. | |
| 2010/0117136 A1 | 5/2010 | Yasuda | |
| 2012/0028401 A1 | 2/2012 | De Munck et al. | |
| 2012/0038024 A1 | 2/2012 | Botula et al. | |
| 2012/0211805 A1 * | 8/2012 | Winkler | B81C 1/00246 257/254 |
| 2012/0292700 A1 | 11/2012 | Khakifirooz et al. | |
| 2013/0043490 A1 | 2/2013 | Sorada | |
| 2013/0320459 A1 | 12/2013 | Shue et al. | |
| 2014/0042595 A1 | 2/2014 | Schulze et al. | |
| 2014/0097402 A1 | 4/2014 | Wang et al. | |
| 2014/0151852 A1 | 6/2014 | Adkisson et al. | |
| 2014/0252481 A1 | 9/2014 | Flachowsky et al. | |
| 2014/0353725 A1 | 12/2014 | Adkisson et al. | |
| 2015/0179755 A1 | 6/2015 | Rooyackers et al. | |
| 2015/0179791 A1 | 6/2015 | Kudou | |
| 2015/0194416 A1 | 7/2015 | Cheng et al. | |
| 2015/0318665 A1 | 11/2015 | Liang | |
| 2015/0348825 A1 | 12/2015 | Hebert | |
| 2016/0372592 A1 | 12/2016 | Cho | |
| 2017/0110574 A1 | 4/2017 | LaVen et al. | |
| 2017/0117224 A1 | 4/2017 | Adusumilli et al. | |
| 2017/0170056 A1 | 6/2017 | Jaffe et al. | |
| 2018/0083098 A1 | 3/2018 | Goktepeli | |
| 2019/0013382 A1 | 1/2019 | Stamper et al. | |

OTHER PUBLICATIONS

Response to Office Action in related U.S. Appl. No. 15/876,727 dated Apr. 11, 2019, 7 pages.
Final Office Action in related U.S. Appl. No. 15/703,220 dated Mar. 19, 2019, 17 pages.
Response to Final Office Action in related U.S. Appl. No. 15/645,655 dated Mar. 20, 2019, 11 pages.
Final Office Action in related U.S. Appl. No. 15/645,655 dated Jan. 31, 2019, 16 pages.
Office Action in U.S. Appl. No. 15/703,220 dated Oct. 18, 2019, 18 pages.
Response to Office Action in U.S. Appl. No. 15/703,220 dated Jan. 17, 2020, 12 pages.
Office Action in related U.S. Appl. No. 15/876,727 dated Jan. 11, 2019, 10 pages.
Taiwanese Office Action and Search Report in related TW Application No. 106132441 dated Dec. 7, 2018, 14 pages.
Final Office Action in U.S. Appl. No. 15/703,220 dated Mar. 16, 2020, 21 pages.
Response to Final Office Action in U.S. Appl. No. 15/703,220 dated Apr. 20, 2020, 16 pages.
Taiwanese Office Action and Search Report in related TW Application No. 106132441 dated Mar. 3, 2020, 10 pages.
Hashimoto et al., "A Study on Suppressing Crosstalk Through a Thick SOI Substrate and Deep Trench Isolation", IEEE, Jul. 2013, vol. 1, No. 7, 7 pages.
Ohguro et al., "High performance digital-analog mixed device on a Si substrate with resistivity beyond 1 kΩ cm", IEEE, 2000, 4 pages.

(56) References Cited

OTHER PUBLICATIONS

Response to Office Action in related U.S. Appl. No. 15/645,655, filed Oct. 18, 2018, 12 pages.
Office Action in related U.S. Appl. No. 15/645,655 dated Jul. 19, 2018, 17 pages.
Taiwanese Office Action in related U.S. Appl. No. 106132441 dated Jul. 16, 2018, 10 pages.
Office Action in related U.S. Appl. No. 15/703,220 dated Sep. 5, 2018, 27 pages.
Response to Office Action in related U.S. Appl. No. 15/703,220, filed Dec. 5, 2018, 12 pages.
Taiwanese Office Action in related U.S. Appl. No. 107112403 dated Oct. 18, 2018, 9 pages.
Taiwanese Office Action in TW Application No. 106132441 dated Jun. 4, 2019, 10 pages.
Response to Final Office Action in U.S. Appl. No. 15/703,220, filed Apr. 25, 2019, 13 pages.
Second Response to Final Office Action in U.S. Appl. No. 15/703,220, filed Jun. 5, 2019, 13 pages.
Notice of Allowance in U.S. Appl. No. 15/876,727 dated Jun. 12, 2019, 9 pages.
Notice of Allowance in U.S. Appl. No. 15/645,655 dated Jul. 19, 2019, 9 pages.
DE Office Action in DE Application No. 102018222690.3 dated May 28, 2020, 9 pages.
Office Action in U.S. Appl. No. 16/575,675 dated Jun. 30, 2020, 11 pages.
Notice of Allowance in U.S. Appl. No. 15/703,220 dated Jun. 15, 2020, 8 pages.
Notice of Allowance in U.S. Appl. No. 16/575,675 dated Oct. 15, 2020, 8 pages.
Response to Office Action in U.S. Appl. No. 16/575,675, filed Sep. 14, 2020, 8 pages.
Office Action in U.S. Appl. No. 16/206,375 dated Oct. 19, 2020, 12 pages.
Office Action in U.S. Appl. No. 16/538,062 dated Oct. 6, 2020, 7 pages.
Taiwanese Office Action in TW Application No. 108139071 dated Aug. 21, 2020, 9 pages.
Taiwanese Notice of Allowance in TW Application No. 106132441 dated Sep. 8, 2020, 4 pages.

* cited by examiner

CAVITY STRUCTURES UNDER SHALLOW TRENCH ISOLATION REGIONS

FIELD OF THE INVENTION

The present disclosure relates to semiconductor structures and, more particularly, to cavity structures under shallow trench isolation regions and methods of manufacture.

BACKGROUND

Radio frequency (RF) devices are used in many different types of communication applications. For example, RF devices can be used in cellular telephones with wireless communication components such as switches, MOSFETs, transistors and diodes.

RF devices are typically manufactured on high resistivity silicon wafers or substrates to achieve the needed RF linearity. State-of-the-art trap rich silicon on insulator (SOI) high resistivity substrates offer excellent vertical isolation and linearity, but the SOI wafer can be up to 50% of the total manufacturing cost because they can be 5 to 10 times the cost of high resistivity non-SOI substrates, i.e., a RF device formed on a SOI wafer could have a total normalized manufacturing cost of 1.0 while a similar device formed on a high resistivity non-SOI bulk wafer could have a total normalized manufacturing cost of 0.6. Devices built on bulk Si substrates have been known to suffer from degraded linearity, harmonics, noise and leakage currents, any of which will degrade device performance thus necessitating the higher cost of SOI wafers.

SUMMARY

In an aspect of the disclosure, a structure comprises: one or more cavity structures provided in a substrate material and sealed with an epitaxial material; and a shallow trench isolation region directly above the one or more cavity structures in the substrate material.

In an aspect of the disclosure, a structure comprises: one or more cavity structures provided in a substrate material and sealed with an epitaxial material having an oxidized upper surface; a shallow trench isolation region directly above the one or more cavity structures and contacting the oxidized upper surface; and at least one passive device positioned over the shallow trench isolation region and directly above the one or more cavity structures.

In an aspect of the disclosure, a method comprises: forming one or more cavity structures in a substrate material; sealing the one or more cavity structures with epitaxial material; forming a trench structure over the one more cavity structures which exposes the epitaxial material; oxidizing the epitaxial material; filling in the trench structure over the oxidizing epitaxial material to form a shallow trench isolation region directly above the one or more cavity structures; and forming a device on the shallow trench isolation region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
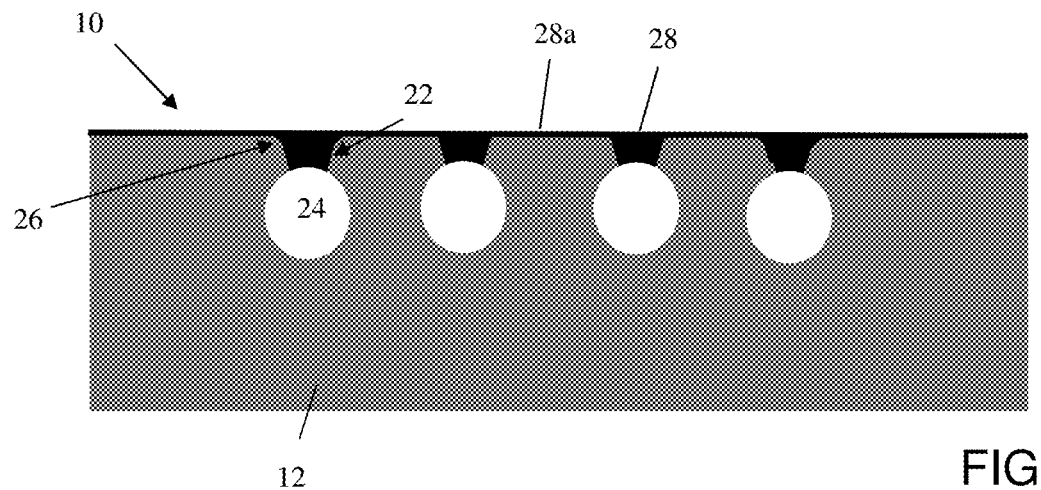
FIG. 1 shows cavity structures and respective fabrication processes in accordance with aspects of the present disclosure.

The present disclosure relates to semiconductor structures and, more particularly, to cavity structures under shallow trench isolation regions and methods of manufacture. More specifically, the present disclosure includes localized cavity structures which are positioned under shallow trench isolation regions, and more particularly under passive devices, e.g., inductors, polySi pn pin diodes, Efuses, etc. Advantageously, the cavity structures disclosed herein improve performance of the passive devices, e.g., inductors, by reducing the eddy currents flowing through the silicon substrate, hence enhancing the quality factor of inductors above the cavity region. Moreover, the cavity structures can provide improved decoupling of the inductor and substrate. The cavity structures also increase the distance between the substrate and the passive devices (inductors, polySi pn diodes, pin diodes, electrostatic discharge (ESD) devices, MIMs, Efuses, etc.), which lower coupling to the substrate and, hence lower substrate capacitance loss.

In embodiments, the cavity structures are located under the shallow trench isolation regions below inductors (or polySi pn diodes, pin diodes, ESD devices, MIMs, Efuses, etc.). The cavity structures can be filled with air and can be used for any Bulk Si wafer technologies where passive devices are present to improve the Q-factor. The cavity structures can be sealed with epi-SiGe and oxidized before shallow trench isolation regions are filled on top of an oxidized Si and the oxidized SiGe. The cavity structures can also be used to avoid expensive SOI wafers and/or high resistivity wafers. For example, the cavity structures can be formed in bulk silicon wafers with standard resistivity of about 0.01 to 100 ohm-cm; although the cavity structures can also be used in high resistivity silicon wafers, e.g., a resistivity of about >1 Kohm–cm to about 10 Kohm-cm or higher. In addition, the cavity structures can be filled with air underneath the shallow trench isolation region below inductors to reduce eddy currents and improve decoupling between inductor (or polySi pn pin diodes, MIMs, ESD devices, Efuses, etc.) and substrate.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks:

(i) deposition of thin films of material on a substrate, (ii) applying a patterned mask on top of the films by photolithographic imaging, and (iii) etching the films selectively to the mask.

FIG. 1 shows cavity structures and respective fabrication processes in accordance with aspects of the present disclosure. In particular, the structure 10 includes a substrate 12. The substrate 12 can comprise any semiconductor material such as, e.g., Si, GaAs, etc. In embodiments, the substrate 12 is composed of crystalline silicon. In another embodiment, the substrate 12 can be composed of any suitable semiconductor materials such as, e.g., SiGe, SiGeC, SiC, InAs, InP, and other III/V or II/VI compound semiconductors. For example, the substrate 12 is composed of standard silicon, e.g., less than 1 Kohm/sq., or high resistivity silicon with resistivity in the range of about between 1 Kohm-cm to 10 Kohm-cm, as an illustrative example.

Still referring to FIG. 1, one or more pad films (not shown), such as but not limited to, silicon dioxide (oxide) and silicon nitride (nitride) are deposited on the substrate 12. In embodiments, the nitride pad film can be deposited by a conventional deposition process, e.g., chemical vapor deposition (CVD), to a thickness of about 100 nm to 200 nm; whereas, the oxide pad film can be deposited to a thickness of about to 5-30 nm. The oxide can be grown using a thermal oxidation or other methods known in the art such as CVD, PVD (plasma vapor deposition), or ALD (atomic layer deposition). If the substrate 12 is formed from silicon than the oxide can be formed in furnace oxidizations of the silicon.

Referring still to FIG. 1, openings or trenches 22 are etched into the substrate 12. The trenches 22 can include, as viewed from above or below, "holes" and/or "bars". In embodiments, holes would have 1:1 aspect ratio as seen from above, while bars would have aspect ratios >1:1, such as 10:1 or 100:1, as seen from above. The trenches 22 can be formed by conventional lithography and etching processes known to those of skill in the art such that no further explanation is required for a complete understanding of the present disclosure. In one illustrative example, the trenches are 120 nm wide and are 0.7 micron deep into the substrate 12. In further embodiments, the width of the trenches 22 can be larger around 0.2 µm (or smaller than 120 nm) and a spacing between adjacent trenches can be about 0.8 µm or more.

Referring still to FIG. 1, a sidewall liner (now shown) is formed on the sidewalls of the trenches 22 by oxidizing and/or depositing oxide on the sidewalls and anisotropic etching the dielectric oxide material from the bottom and top planar features of the structure. In embodiments, the sidewall liner is one or more of any suitable dielectric materials such as oxide or nitride deposited using any known deposition method, e.g., CVD, thermal oxidation of the silicon substrate, or ALD or any of these combinations. In embodiments, the anisotropic etch could consist of a RIE using a perfluorocarbon-based chemistry, as is known in the art, which etches material from planar surfaces but leaves the dielectric material on the sidewall of the trenches 22.

The sidewall liner should robustly coat the sidewalls of the trenches 22 in order to protect the underlying substrate material 12 from subsequent etching processes (for cavity formation). To achieve this robust sidewall coverage, the dielectric material needs to be thick enough to leave a thick film on the sidewalls of the trenches 22 but not too thick that it pinches off the top opening of the trenches 22, which would prevent cavity formation during the successive cavity etch. For example, 40 nm of nitride can be deposited on a 100 nm wide trench. In another embodiment, for example, the sidewall of trenches 22 are thermally oxidized to form a $SiO_2$ layer.

As shown further in FIG. 1, cavity structures 24 are selectively formed in the substrate 12 by a substrate etching process through the bottom of the trenches 22. The pad films on the substrate surface and the spacer (e.g., sidewall liner) on the side of the trenches 22 protect the substrate 12 from being unintentionally etched during the cavity formation. In embodiments, an optional vapor or liquid HF treatment, hydrogen plasma, anneal, basic or acidic chemical clean, or any process known to remove thin or native dielectrics or residual spacer etch polymer from the substrate 12 (e.g., silicon) can be used to remove any excessive dielectric at a bottom of the trenches 22 prior to etching of the cavity structures 24.

Following the formation of the sidewall liner or spacer and optional clean(s), exposed substrate material at the bottom of the trench 22 can be removed to form the cavity structures 24. In embodiments, the exposed substrate material 12 can be removed by a wet etching process or dry etching process. For example, dry etchants can include plasma-based $CF_4$, plasma-based $SF_6$, or gas $XeF_4$ silicon etch, etc., and wet etching processes can include KOH and $NH_4OH$. In embodiments, the cavity structures 24 can be formed under what will be the shallow trench isolation structures below a passive device, e.g., inductor. In embodiments, the upper surface of the cavity structure 24 can be about 300 nm in depth below the top surface of the substrate 12; although other dimensions are also contemplated herein. In addition, the cavity structures 24 can have a diameter of about 200 nm to about 800 nm as an example; although other dimensions are contemplated herein.

After formation of the cavity structures 24, the sidewall liner and pad dielectrics are removed, exposing the upper surface of the substrate 12 and the sidewalls of the trenches 22. In embodiments, the sidewall liner and pad dielectrics can be removed by a conventional etching process selective to such materials, e.g., only or a combination of hot phosphorous followed by an HF chemistry or vice-versa.

Following the removal of the sidewall liner and pad dielectrics, the trenches 22 are subjected to an optional annealing process to soften or round (curve) the edges of the trenches, as shown representatively at reference numeral 26. By way of one example, following a HF preclean process, the structure can undergo an annealing process at a temperature range of about 600° C. to about 1100° C., for up to about 60 seconds. In more specific embodiments, the annealing process can be at a temperature of about 650° C. for 60 seconds. In embodiments, the annealing process can be performed in an $H_2$ atmosphere; although other hydrogen atmospheres are also contemplated herein, e.g., $NH_3$, $B_2H_6$, Phi, $AsH_2$ or other gases bonded to hydrogen. In embodiments, the annealing in an $H_2$ or other hydrogen atmosphere may remove any native or other oxide from the silicon substrate surface. This annealing process may smooth or reflow the walls of the cavity structures 24.

In embodiments, a material 28 is deposited or epitaxially grown on the surface of the substrate 12 including, e.g., the curvature 26, sidewalls of the trenches 22 and sidewalls of the cavity 24. In embodiments, the material 28 can be epitaxial SiGe deposited or grown using ultra high vacuum CVD (UHVCVD); although other semiconductor materials, poly or epi films, and deposition processes are also contemplated herein. By way of example, SiGe material can be deposited or grown at a temperature of about 500° C. to 850° C., resulting in a thickness of about 5 nm to about 50 nm. In embodiments, 15 nm of SiGe is deposited or grown at 650° C. and the trench width 22 is 120 nm. It should be understood that other thicknesses of the material 28 can be applied, depending on the critical dimension of the trenches 22. In general, as the width of the trench 22 increases, the thickness of material 28 to fill in the top of the trench 22 during the subsequent reflow anneal increases.

As further shown in FIG. 1, following the deposition or growth of the material 28, the wafer is heated to equal to or greater than the reflow temperature of material 28 so that material 28 fills in the top of trench 22. In this way, the cavity structures 24 are sealed (e.g., filled with air). During the reflow temperature, some of the material 28 can remain on the surface of the structure as shown at reference numeral 28a, which can act as an etch stop layer for subsequent fabrication processes. For the case where the substrate 12 is silicon, since SiGe has a lower reflow temperature than silicon, SiGe material 28 can be reflowed into the opening of the trench 22 to plug or fill the top of the trench 22 without filling in the cavity 24.

In embodiments, the reflow temperature of the material 28 is about 700° C. to 1050° C. and the reflow time is anywhere up to about 600 seconds. It should also be noted that application of temperature during the reflow process will affect the size and shape of the cavity structures 24. In particular, the cavity structures 24 become a different shape, e.g., oval shape, slightly shrinking its volume compared to its original shape.

Figure 2:
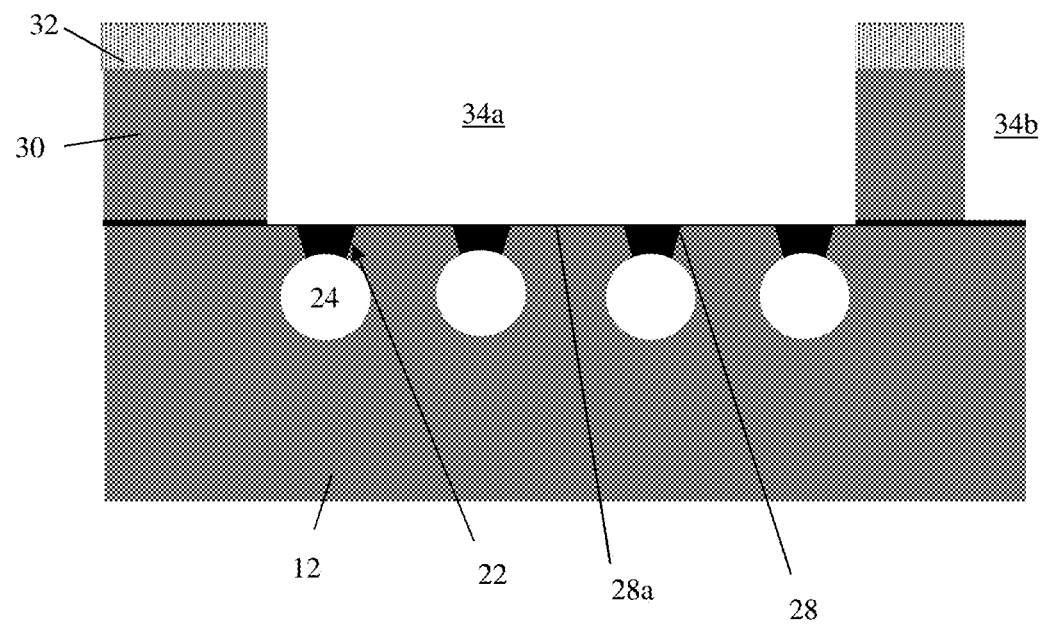
FIG. 2 shows a shallow trench formed over the cavity structures, amongst other features, and respective fabrication processes in accordance with aspects of the present disclosure.

FIG. 2 shows a shallow trench formed over the cavity structures, amongst other features, and respective fabrication processes in accordance with aspects of the present disclosure. In embodiments, a shallow trench 34a is formed over the cavity structures 24 and another shallow trench 34b to the side thereof, e.g., active regions of a device. The shallow trenches 34a, 34b can be formed by conventional lithography and etching processes, e.g., using timed etching processes with dry chemistries. In embodiments, the etching process may partially etch SiGe material 28, e.g., seals, to expose them.

By way of example, a layer of substrate material 30 is formed over the sealed cavity structures 24, followed by a deposition of a pad material 32. In embodiments, the substrate material 30 is a same material as the substrate 12. For example, the substrate 30 can be epitaxially grown Si. The pad material 32 can be a nitride material or an oxide material or a combination of oxide and nitride. A resist (not shown) formed over the pad material 32 is exposed to energy (light) to form a pattern (opening). An etching process with a selective chemistry, e.g., RIE, will be used to form one or more trenches 34a, 34b in the semiconductor material 30 and substrate pad material 32, through the openings of the resist. The resist can then be removed by a conventional oxygen ashing process or other known stripants. As shown in FIG. 2, the trenches 34a are directly over and aligned with the cavity structures 24.

Figure 3:
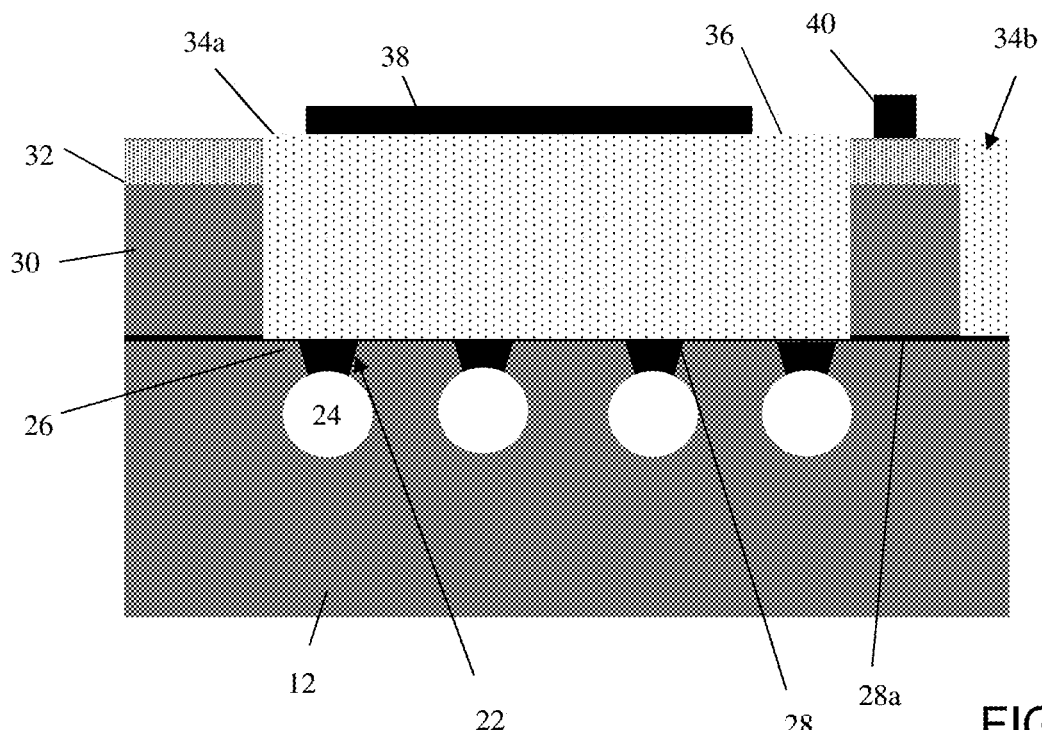
FIG. 3 shows a shallow trench isolation structure and passive devices above the cavity structures, amongst other features, and respective fabrication processes in accordance with aspects of the present disclosure.

As shown in FIG. 3, following the formation of the trenches 34a, 34b, a dielectric deposition or growth such as an oxidization process is performed to line the trenches 34a, 34b. In this way, the substrate 12 and the material 28 can be oxidized, above the sealed cavity structures 24. The remaining portions of the trenches 34a, 34b can be filled with oxide material 36 using a conventional CVD process, followed by a chemical mechanical polishing (CMP) process. This process forms the shallow trench isolation regions directly over the sealed cavity structures 24.

At this stage, the wafers are ready for CMOS fabrication processes, e.g., formation of passive devices 38 and active devices 40. In embodiments, the passive devices 38 can be inductors, capacitors, diodes, Si photonics, e.g., waveguides, photodetectors, MEMs devices, etc., each of which are formed over the shallow trench isolation structures, directly over top of the cavity structures 24. Similarly, the active devices 40, e.g., transistors, can be fabricated above active regions of the structure, e.g., adjacent or to the sides of the shallow trench isolation structures.

In embodiments, the passive devices 38 can be inductors fabricated using conventional deposition and CMOS patterning processes. In embodiments, the inductors can be metal lines having the following non-limiting, illustrative parameters:

(i) Outside diameter=200 µm;
(ii) Number of turns=3;
(iii) Turn width=5 µm;
(iv) Space width=5 µm;
(v) Underpath width=15 µm; and
(vi) Inductor underpath levels: thick metal.

By implementing the features described herein, e.g., cavity structures below the inductors, the Q-factor of the inductor can be increased by 50% compared to conventional integrated inductors.

Figure 4:
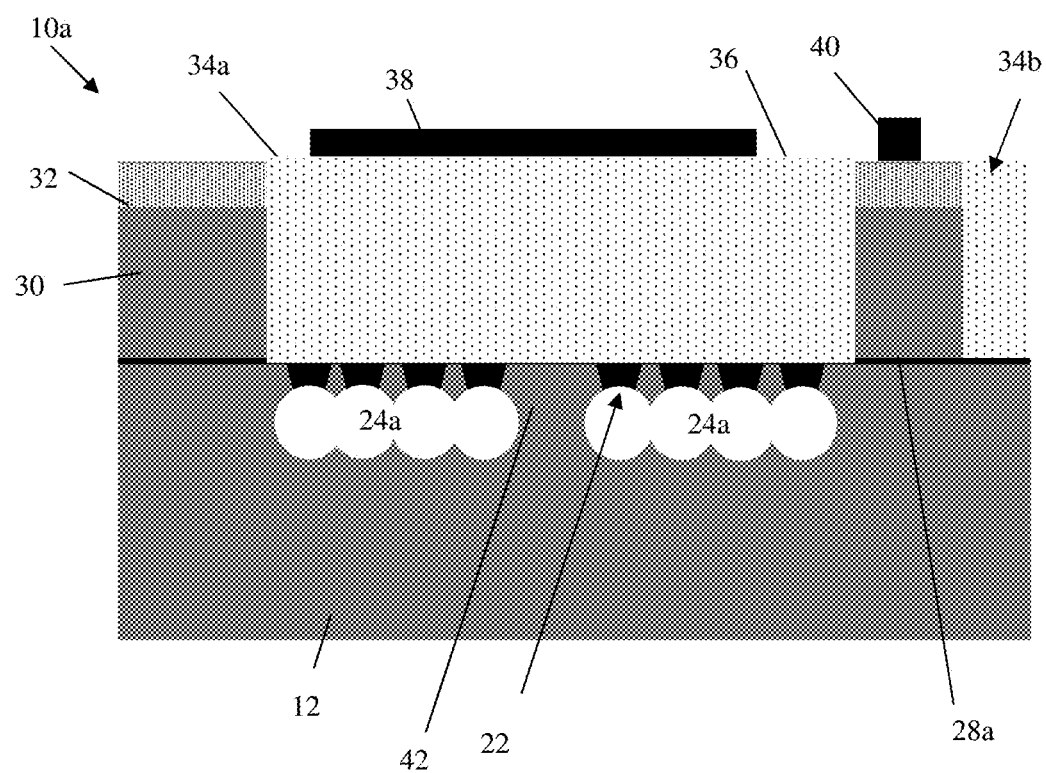
FIG. 4 shows a shallow trench isolation structure and passive devices above merged cavity structures, amongst other features, and respective fabrication processes in accordance with another aspects of the present disclosure.

FIG. 4 shows shallow trench isolation structure above merged cavity structures 24a, amongst other features, and respective fabrication processes in accordance with another aspects of the present disclosure. In this embodiment, the structure 10a includes merged cavity structures 24a fabricated by extending the etch process of the cavities shown in FIG. 1. In addition, a post or pillar 42 is provided between each set of the merged cavity structures 24a. In embodiments, the post 42 is composed of the substrate material, e.g., Si. The post 42 will prevent the collapse of the structure, i.e., providing rigidity so that the merged cavity structures 24a do not collapse under the weight of the shallow trench isolation region and/or passive device 38. In embodiments, the merged cavity structures 24a can be a staggered pattern for mechanical strength. Also, the pillar size can be about 2×2 µm$^2$ with a pillar repetition of about 10 µm. It should be understood, though, that other dimensions are also contemplated herein.

The remaining features of FIG. 4 are similar to that already described with respect to FIG. 3. For example, a layer of substrate material 30 is formed over the sealed merged cavity structures 24a, followed by a pad material 32. An etching process with a selective chemistry, e.g., RIE, will be used to form one or more trenches in the semiconductor material 30 and substrate pad material 32, through the openings of the resist. As shown in FIG. 4, the trenches 34a are directly over and aligned with the merged cavity structures 24a. The sealed material is oxidized following the trenches 34a, 34b being filled with oxide material to form the shallow trench isolation regions. At this stage, the wafers are ready for CMOS fabrication processes, e.g., formation of passive devices 38 and active devices 40.

Figure 5A:
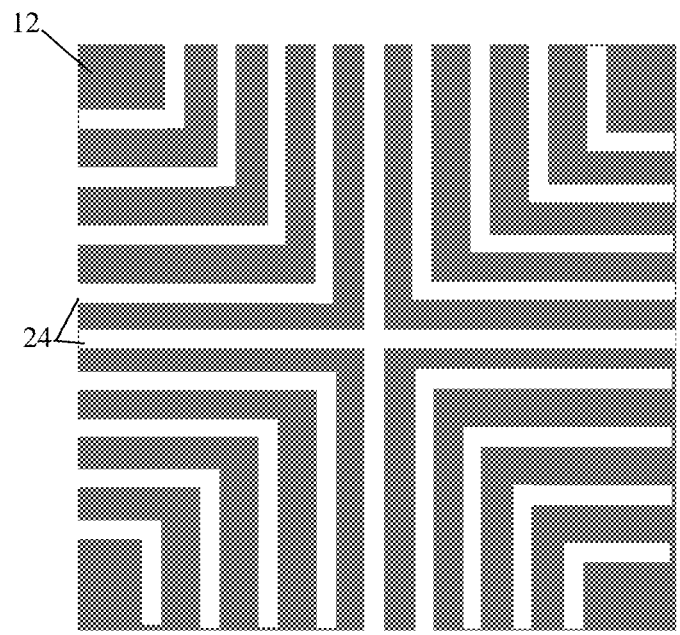
FIGS. 5A-5E show top views of different layouts of the cavity structures in accordance with aspects of the present disclosure.
Figure 5B:
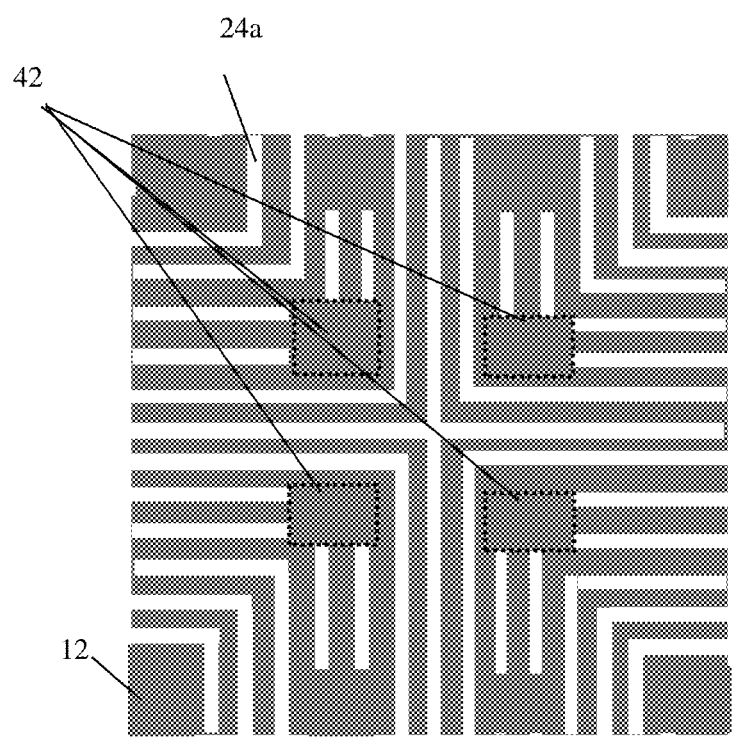
Figure 5C:
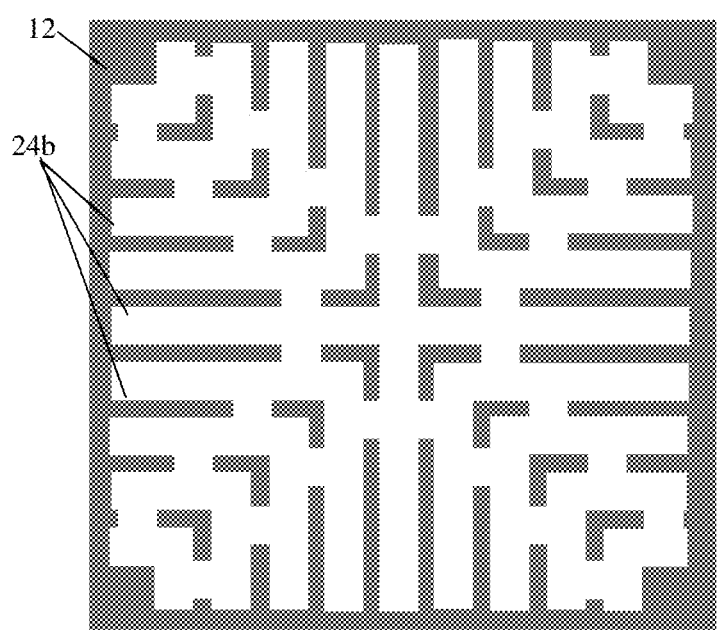
Figure 5D:
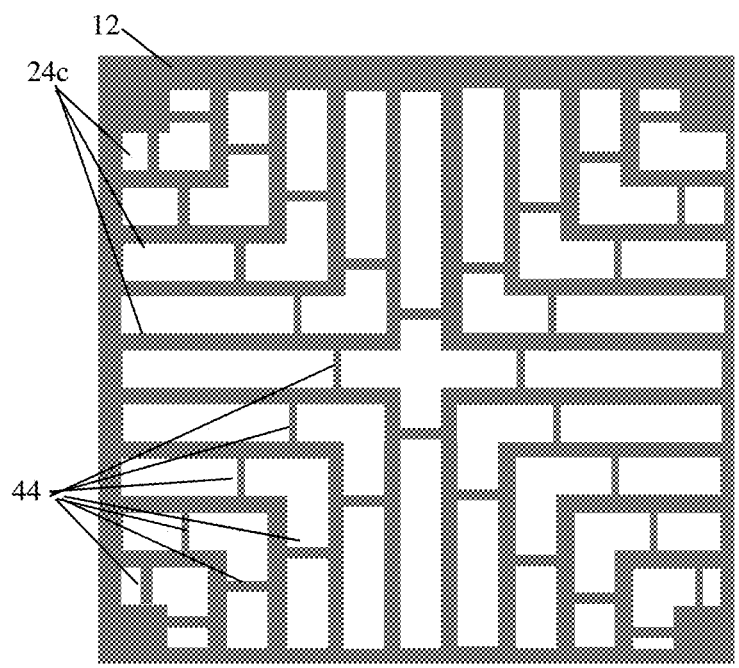
Figure 5E:
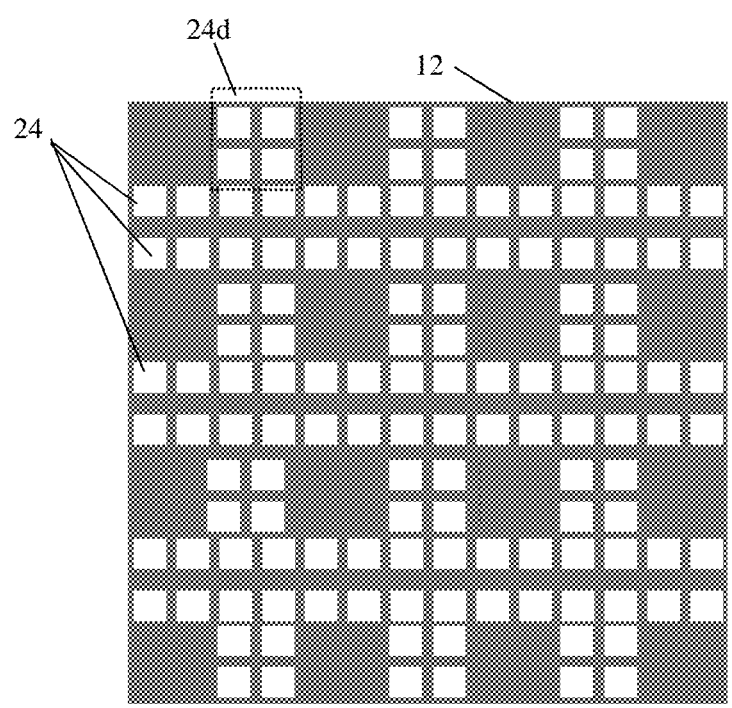

FIGS. 5A-5E show top views of different layouts of the cavity structures in accordance with aspects of the present disclosure. In particular, FIG. 5A shows continuous L-shaped cavity structures 24b. In this embodiment, the width of the cavity structures 24 can be about 0.12 to 0.2 µm and the spacing between adjacent cavity structures 24 can be about 0.8 µm. In such embodiment, the trenches will not merge. FIG. 5B shows merged cavity structures 24a with Si pillars 42. In this example, the width of the cavity structures 24a can be about 0.2 µm, with a spacing between the structures of about 0.4 µm' although other dimensions or combinations thereof are also contemplated herein. The pillars 42 can have a dimension of about 2 µm×2 µm, with a spacing of about 8 µm; although other dimensions or combinations thereof are also contemplated herein. FIG. 5C shows fragmented cavity structures 24*b* and FIG. 5D shows L-shaped cavity structures 24*c* with staggered spacing (e.g., interruptions in the cavity of substrate material 12) as shown by reference numeral 44. FIG. 5E shows a partial checkerboard pattern of individual cavity structures 24 spaced apart from one another forming a plurality of larger square sections 24*d* (which can be composed of 2×2 cavity structures, 4×4 cavity structures, etc.).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   one or more cavity structures provided in a substrate material and sealed with an epitaxial material; and
   a shallow trench isolation region located in a substrate layer and which is located over the one or more cavity structures in the substrate material.

2. The structure of claim 1, wherein the epitaxial material is semiconductor material.

3. The structure of claim 1, wherein the epitaxial material has an oxidized top surface and the shallow trench isolation region directly contacts the oxidized top surface.

4. The structure of claim 1, wherein the one or more cavity structures are filled with air.

5. The structure of claim 1, wherein the one or more cavity structures are a plurality of merged cavity structures supported by a pillar of substrate material.

6. The structure of claim 1, further comprising at least one passive device on the shallow trench isolation region, directly above the one or more cavity structures.

7. The structure of claim 6, wherein the passive device is an inductor.

8. The structure of claim 7, wherein the one or more cavity structures are located to improve decoupling between the passive device and the substrate material and to disrupt an eddy current in the substrate material in case of an inductor.

9. The structure of claim 1, wherein the one or more cavity structures are L-shaped cavities.

10. The structure of claim 1, wherein the epitaxial material and substrate layer are SiGe.

11. The structure of claim 1, wherein the epitaxial material is reflowed semiconductor material and the shallow trench isolation region is directly above the one or more cavity structures.

12. A structure comprising:
    one or more cavity structures provided in a substrate material and sealed with an epitaxial material having an oxidized upper surface;
    a shallow trench isolation region located in a substrate layer above the oxidized upper surface of the substrate material, and which is above the one or more cavity structures and contacting the oxidized upper surface; and
    at least one passive device positioned over the shallow trench isolation region and directly above the one or more cavity structures.

13. The structure of claim 12, wherein the epitaxial material is SiGe material.

14. The structure of claim 12, wherein the one or more cavity structures are filled with air.

15. The structure of claim 12, wherein the one or more cavity structures are a plurality of merged cavity structures.

16. The structure of claim 15, wherein the merged cavity structures are supported by a pillar of substrate material.

17. The structure of claim 12, wherein the at least one passive device is an inductor and the one or more cavity structures disrupts an eddy current in the substrate material which increases a quality factor of the inductor.

18. The structure of claim 17, wherein the one or more cavity structures are L-shaped cavities.

19. The structure of claim 18, wherein L-shaped cavities are staggered.

20. The structure of claim 12, wherein the epitaxial material is reflowed semiconductor material and the shallow trench isolation region is directly above the one or more cavity structures.

* * * * *